United States Patent [19]

Kikuchi

[11] Patent Number: 5,523,621
[45] Date of Patent: Jun. 4, 1996

[54] SEMICONDUCTOR DEVICE HAVING A MULTILAYER CERAMIC WIRING SUBSTRATE

[75] Inventor: Makoto Kikuchi, Ichikawa, Japan

[73] Assignee: Kabushiki Kaisha Toshiba, Kawasaki, Japan

[21] Appl. No.: 438,968

[22] Filed: May 11, 1995

[30] Foreign Application Priority Data

May 15, 1994 [JP] Japan .................... 6-124451

[51] Int. Cl.⁶ ................ H01L 23/48; H01L 23/495; H01L 23/12
[52] U.S. Cl. ............ 257/692; 257/668; 257/700; 257/704; 257/784
[58] Field of Search ................ 257/692, 700, 257/704, 784, 668, 691, 701

[56] References Cited

U.S. PATENT DOCUMENTS

| | | | |
|---|---|---|---|
| 3,825,805 | 7/1974 | Belohoubeck et al. | 257/700 |
| 4,558,346 | 12/1985 | Kida et al. | 257/784 |
| 4,947,234 | 8/1990 | Einzinger et al. | 257/784 |
| 4,984,065 | 1/1991 | Sako | 257/784 |
| 4,985,753 | 1/1991 | Fujioka et al. | 257/704 |
| 5,311,057 | 5/1994 | McShane | 257/784 |
| 5,332,864 | 7/1994 | Liang et al. | 257/700 |

FOREIGN PATENT DOCUMENTS

| | | | |
|---|---|---|---|
| 0047985 | 2/1993 | Japan | 257/676 |
| 0120368 | 4/1994 | Japan | 257/676 |

*Primary Examiner*—Rolf Hille
*Assistant Examiner*—David Ostrowski
*Attorney, Agent, or Firm*—Finnegan, Henderson, Farabow, Garrett & Dunner

[57] ABSTRACT

In order to set the potential of corner leads formed from a lead frame equal to that of power source leads such as ground, a multilayer wiring substrate is mounted on a mounting substrate of a package and its potential is set equal to that of the power source leads, or a multilayer mounting substrate is formed to electrically connect electrode pads of a semiconductor substrate to the power source and corner leads by bonding wires. The inductance of the power source leads can be lowered, and the number of signal leads interposed between the power source leads can be reduced to the minimum. Consequently, variations in frequency used in the entire package can be prevented, and impedance matching can be made.

6 Claims, 5 Drawing Sheets

SEMICONDUCTOR DEVICE HAVING A MULTILAYER CERAMIC WIRING SUBSTRATE

BACKGROUND OF THE INVENTION

1. Field of the Invention

The present invention relates to a semiconductor device of good high frequency characteristics used in a frequency band ranging from, e.g., 300 MHz to 1 GHz.

2. Description of the Related Art

Figure 12:
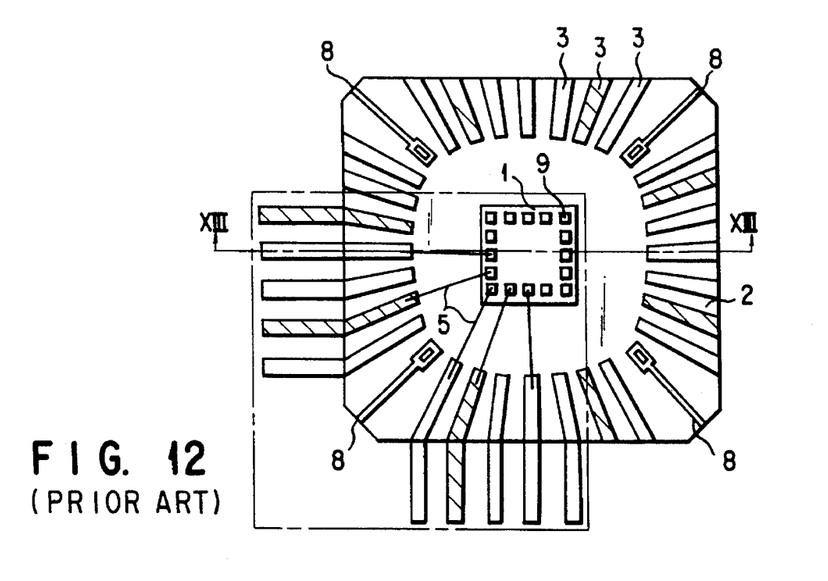
FIG. 12 is a plan view of a prior art semiconductor device.
Figure 13:
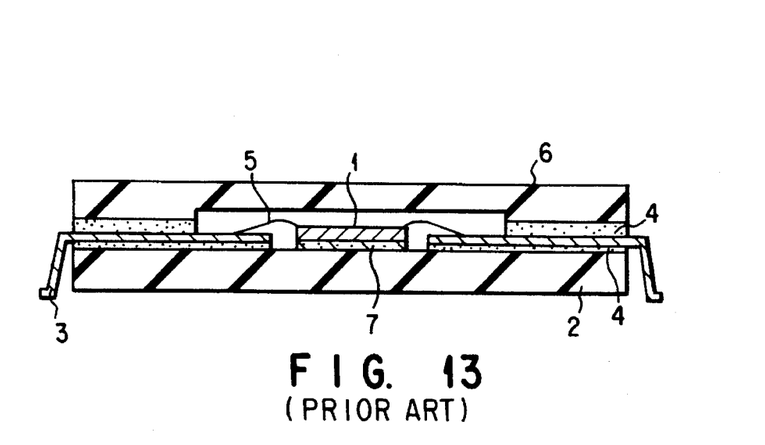
FIG. 13 is a cross-sectional view taken along the line XIII—XIII of FIG. 12.

A semiconductor device incorporating an IC, an LSI, etc. is usually housed in a package formed of ceramics. FIG. 12 is a plan view of a prior art semiconductor device excluding a cap. Leads 3 and 8, projecting from a substrate 2 on which a semiconductor substrate 1 is mounted, and bonding wires 5 are shown only within an area surrounded by the one-dot-one-dash line in FIG. 12. FIG. 13 is a cross-sectional view taken along the line XIII—XIII of FIG. 12.

A semiconductor substrate 1 of typically silicon, on which an integrated circuit is formed, is mounted on a central portion of the mounting substrate 2 of ceramics such as aluminum nitride. Leads 3 obtained from a lead frame formed of an Fe alloy containing Ni by 42 wt %, are bonded onto the periphery of the mounting substrate 2 by an insulative sealing member 4 such as glass. The leads 3 are spaced away from the semiconductor substrate 1 and arranged opposite to each other with respect to the substrate 1. The end portions (inner leads) of the leads 3 are bonded to bonding electrodes of electrode pads 9, which are formed on the surface of the substrate 1 to be electrically connected to the integrated circuit thereon, by bonding wires 5 such as Au and Al lines. These leads 3 are employed as power source lines and signal lines.

Of the leads, leads 8 (hereinafter referred to as corner leads) extend from the respective corners of the substrate 2 toward the center thereof, and usually serve as supporting members of the lead frame. Even though the semiconductor device is completed, the corner leads 8 are not used as power or signal lines but in a floating state. Therefore, no wires are usually bonded to the corner leads 2. The substrate 2 is capped with a cap 6 of the same material as that of the sealing member 4. That major surface of the cap 6 which contacts the mounting substrate 2, has a recess. The semiconductor substrate 1, inner leads of leads 3, and bonding wires 5 are housed in the recess and sealed with the cap 6. The cap 6 is made of ceramics such as aluminum nitride as is the mounting substrate. The semiconductor substrate 1 is adhered onto the mounting substrate 12 by a conductive adhesive 7 such as epoxy resin. As illustrated in FIG. 12, the leads 3 contain power source lines (hatched) and signal lines (outlined), and a plurality of signal lines are interposed between two power source lines.

Most semiconductor devices have recently been used in a high frequency band. Since the foregoing semiconductor device shown in FIGS. 12 and 13 employs the leads, constituted by the lead frame, as power source lines, it increased in inductance and then in noise. As shown in FIG. 12, the end portions of the corner leads 8 do not constitute outer leads, in other words, the corner leads are not usually connected to any wires but rendered in a floating state. According to the arrangement of FIG. 12, a signal lead is located on either side of each corner lead, and a power source lead such as ground is located outside the signal lead. Since, however, two signal leads and one corner lead are arranged between two power source leads which are spaced away from each other, if the frequency exceeds 300 MHz, a resonance may occur, with the result that a signal with a frequency, which is higher than that of the signal lead, cannot be transmitted through the signal lead, and no impedance matching can be made.

If the potential of the corner leads is set equal to that of the power source leads, the frequency of signals transmitted through the signal leads can be increased. If, however, wires are bonded to the corner leads, the number of pads for power sources can be increased on the semiconductor substrate on which the IC is formed. For this reason, the semiconductor substrate is increased in size, as is the mounting substrate.

As is evident from the above, the frequencies applicable to the respective signal leads decrease as the respective signal leads separate from the power source leads. The frequencies therefore vary greatly.

SUMMARY OF THE INVENTION

The present invention has been developed in consideration of the above situation. An object of the present invention is to provide a semiconductor device operable within a high frequency band and having power source lines capable of matching of characteristic impedances. Another object of the present invention is to provide a semiconductor device with a structure having a shield effect and capable of easily obtaining a potential from the back of a semiconductor substrate on which an integrated circuit is formed.

A semiconductor device of the present invention is featured in that, in order to set the potential of corner leads formed from a lead frame equal to that of power source leads such as ground, a multilayer wiring substrate is mounted on a mounting substrate of a package and its potential is set equal to that of the power source leads. Alternatively, a multilayer mounting substrate is formed to electrically connect power source pads of a semiconductor substrate to the power source and corner leads by bonding wires.

According to one aspect of the present invention, there is provided a semiconductor device comprising:

a semiconductor substrate on which an integrated circuit is formed, the semiconductor substrate having connecting electrodes of signal pads and power source pads on a surface thereof;

a polygonal mounting substrate having a major surface to a central portion of which the semiconductor substrate is fixed;

a plurality of leads including signal leads and power source leads, end portions of the plurality of leads being arranged on a periphery of the major surface of the mounting substrate so as to be opposed to the semiconductor substrate;

at least one multilayer wiring substrate including a plurality of connecting electrodes on a surface thereof and fixed onto the mounting substrate between the semiconductor substrate and the leads, the connecting electrodes being electrically connected to each other by an inner wiring layer formed in the multilayer wiring substrate;

bonding wires for bonding the end portions of the leads to the connecting electrodes of the semiconductor substrate or to the connecting electrodes of the multilayer wiring substrate; and a cap for covering at least the semiconductor substrate, the bonding wires, and the end portions of the leads, wherein the plurality of leads include corner leads extending from corner portions of the mounting substrate toward the semiconductor substrate, and the corner leads are set to the same potential as that of the power leads.

The signal leads are bonded to the signal pads of the semiconductor substrate by the bonding wires, the power source leads are bonded to the power source pads of the semiconductor substrate by the bonding wires, and the power source leads and the corner leads are bonded to the connecting electrodes of the multilayer wiring substrate by the bonding wires.

Furthermore, the signal leads are bonded to the signal pads of the semiconductor substrate by the bonding wires, the corner leads are bonded to the connecting electrodes of the multilayer wiring substrate by the bonding wires, the power source leads are bonded to the connecting electrodes of the multilayer wiring substrate or the power source pads of the semiconductor substrate, and the connecting electrodes of the multilayer wiring substrate, which are different from the connecting electrodes bonded to the signal leads and the power source leads, are electrically bonded to the power source pads of the semiconductor substrate through the bonding wires.

According to another aspect of the present invention, there is provided a semiconductor device comprising:

a semiconductor substrate on which an integrated circuit is formed, the semiconductor substrate having connecting electrodes of signal pads and power source pads on a surface thereof;

a polygonal mounting substrate having a major surface to a central portion of which the semiconductor substrate is fixed;

a plurality of leads including signal leads and power source leads, end portions of the plurality of leads being arranged on a periphery of the major surface of the mounting substrate so as to be opposed to the semiconductor substrate;

a plurality of connecting electrodes formed on the major surface of the mounting substrate between the semiconductor substrate and the leads, and electrically connected to each other by an inner wiring layer formed in the mounting substrate;

bonding wires for bonding the end portions of the leads to the connecting electrodes of the semiconductor substrate or to the connecting electrodes of the mounting substrate; and a cap for covering at least the semiconductor substrate, the bonding wires, and the end portions of the leads, wherein the plurality of leads include corner leads extending from corner portions of the mounting substrate toward the semiconductor substrate, and the corner leads are set to the same potential as that of the power leads.

The signal pads of the semiconductor substrate by the bonding wires, the power source leads are bonded to the power source pads of the semiconductor substrate by the bonding wires, and the power source leads and the corner leads are bonded to the connecting electrodes of the mounting substrate by the bonding wires.

Furthermore, the signal leads are bonded to the signal pads of the semiconductor substrate by the bonding wires, the corner leads are bonded to the connecting electrodes of the mounting substrate by the bonding wires, the power source leads are bonded to the connecting electrodes of the mounting substrate or the power source pads of the semiconductor substrate, and the connecting electrodes of the mounting substrate, which are different from the connecting electrodes bonded to the signal leads and the power source leads, are electrically bonded to the power source pads of the semiconductor substrate through the bonding wires.

In the semiconductor device having the above structure, the inductance of the power source leads can be lowered, and the number of signal leads interposed between the power source leads can be reduced to the minimum. Consequently, variations in frequency usable in the entire package can be prevented, and impedance matching can be made.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

A semiconductor device according to each of the embodiments of the present invention will be described with reference to the accompanying drawings.

Figure 1:
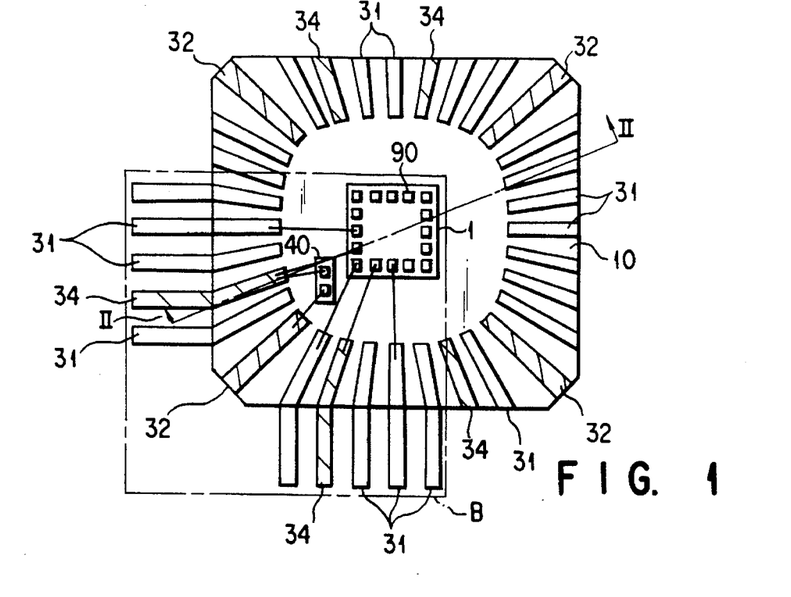
FIG. 1 is a plan view of a semiconductor device according to a first embodiment of the present invention.
Figure 2:
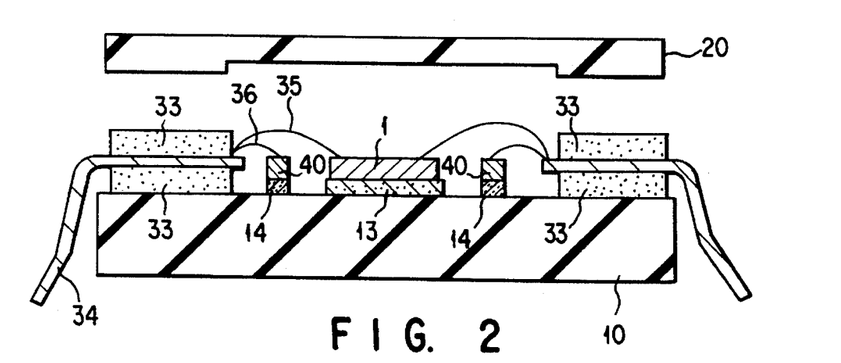
FIG. 2 is a cross-sectional view taken along the line II—II of FIG. 1.
Figure 3:
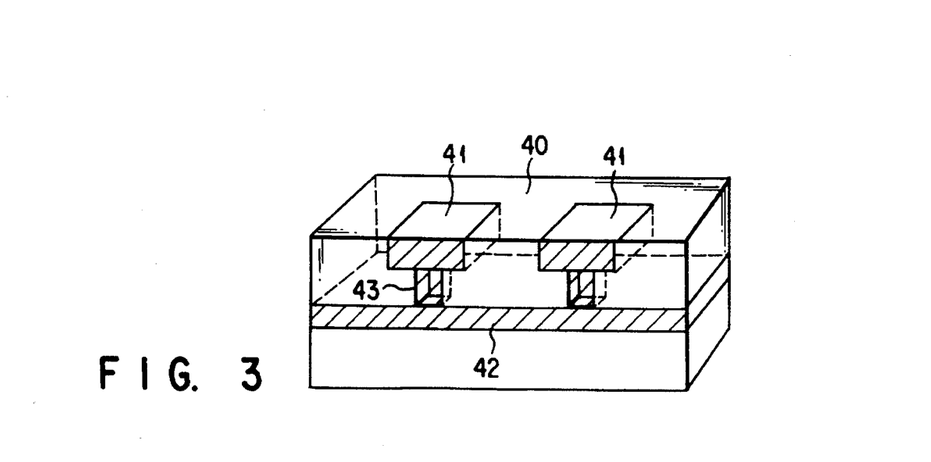
FIG. 3 is a perspective view of a multilayer wiring substrate of the semiconductor device shown in FIG. 1.
Figure 4:
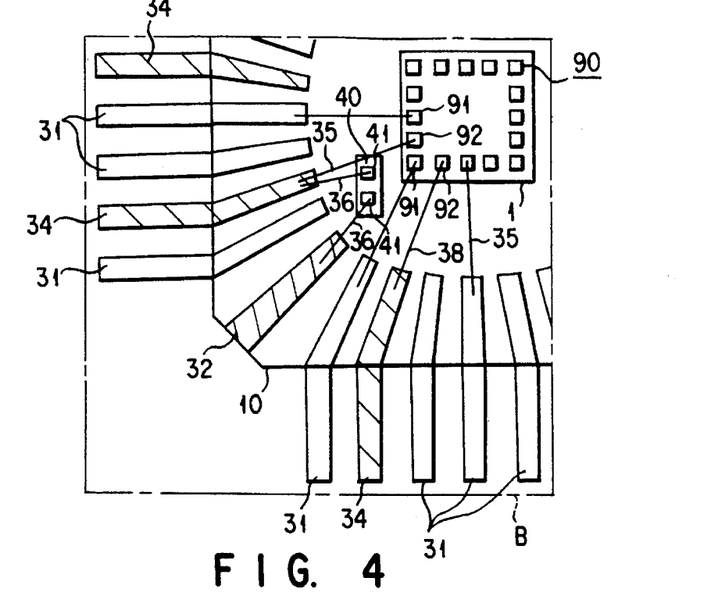
FIG. 4 is an enlarged plan view of corner area B shown in FIG. 1.

First a semiconductor device according to a first embodiment of the present invention will be described with reference to FIGS. 1 to 4. FIG. 1 is a plan view of the semiconductor device, FIG. 2 is a cross-sectional view taken along the line II—II of FIG. 1, FIG. 3 is a sectional, perspective view of a multilayer wiring substrate formed on a mounting substrate of the semiconductor device shown in FIG. 1, and FIG. 4 is an enlarged plan view of corner area B shown in FIG. 1. In FIG. 1, a multilayer wiring substrate and wires other than those of corner area B, a cap and a sealing member, are omitted.

A semiconductor substrate 1 of typically silicon on which an integrated circuit is formed, is placed in a central portion of a mounting substrate 10 which is formed of ceramics such as aluminum nitride and alumina to constitute a package. A plurality of leads 31, 32 and 34 formed from a lead frame of Cu or an Fe alloy containing Ni by 42 wt %, are bonded onto the periphery of the mounting substrate 10 by an insulative sealing member 33 such as glass. These leads are spaced away from the semiconductor substrate 1 and arranged opposite to each other with respect to the substrate 1. The end portions (inner leads) of the leads 31 and 34 are bonded to connecting electrodes 90 of pads formed on the substrate 1 by bonding wires 35 such as Au and Al lines. The connecting electrodes are electrically connected to the integrated circuit of the substrate 1. The leads 31 and 34 are employed as power source lines and signal lines, respectively. The leads 32 (hereinafter referred to as corner leads), extending from the respective corners of the mounting substrate 10 toward the center thereof, are used as power source lines, though conventional corner leads are rendered in a floating state.

According to the first embodiment, a multilayer wiring substrate 40 on the surface of which a plurality of connecting electrodes 41 are formed, is disposed on the mounting substrate 10 and between the semiconductor substrate 1 and the leads 31, 32 and 34. The connecting electrodes 41 are connected to the corner leads 32 by bonding wires 36. FIG. 4 is an enlarged view of corner area B shown in FIG. 1, and the other three corner areas have the same arrangement as that of the area B. In each of the three corner areas, too, a multilayer wiring substrate 40 is formed, and the potential of a corner lead 32 is set equal to that of each lead serving as a power source line. However, the multilayer wiring substrates of the corner areas may differ from one another in position and structure.

As illustrated in FIG. 2, the multilayer wiring substrates 40 are positioned almost symmetrically with regard to the semiconductor substrate 1. As shown in FIG. 3, each substrate 40 includes at least one wiring pattern 42 which is electrically connected to the connecting electrodes 41 by conductive layers 43. Thus, these connecting electrodes 41 are electrically connected to each other through the wiring pattern 42. The multilayer wiring substrate 40 is constituted of, for example, ceramics such as aluminum nitride, and bonded to the mounting substrate 10 by a conductive adhesive 14 such as solder. Bonding wires 36 connected to the power source leads 34, can be connected to the connecting electrodes 41 of the substrate 40.

As illustrated in FIG. 4, the power source leads 34 are electrically connected to power source pads 92 of the connecting electrodes 90 on the semiconductor substrate 1 via the bonding wires, and thus the corner leads 32 are electrically connected to the power source leads 34, whereas the signal leads 31 are connected to signal pads 91 of the connecting electrodes 90 via the bonding wires 35. The mounting substrate 10 is adhered to a cap 20 by the same material as that of the sealing member 33 for bonding the leads to the substrate 10. The cap 20 has a recess in its major surface which is to contact the mounting substrate 10, and the recess covers the semiconductor substrate 1, the inner leads of leads 31, 32 and 34, and the bonding wires 35 and 36 and, in other words, these elements are sealed with the cap 20. The cap 20 is formed of ceramics such as aluminum nitride or alumina which is the same material as that of the substrate 10. The semiconductor substrate 1 is bonded to the central portion of the mounting substrate 10 by a conductive adhesive 13 such as epoxy resin. In FIG. 1, the leads include power source leads 34 (hatched), signal leads 31 (outlined), and corner leads 32 electrically connected to the power source leads 34. At the corner section of the substrate 10 as shown in FIG. 4, the corner lead 32 is interposed between two signal leads 31, and the lead 32 and leads 31 are arranged between two power source leads 34.

The mounting substrate 10 is formed of ceramics such as aluminum nitride and alumina. In the first embodiment, the substrate 10 is quadrangular; however, it can be pentagonal or hexagonal.

While the conventional corner leads are in a floating state, the corner leads 32 of the present invention are set to the same potential as that of the power source leads 34. Therefore, in the present invention, the inductance can be lowered to decrease the noise.

The multilayer wiring substrate 40 shown in FIG. 3 is formed by the following method. A plurality of green sheets each having a conductive paste on its surface, are stacked one on another and sintered. The electrode pads 41 are formed in the surface portion of the sintered structure, and the wiring pattern is formed inside the structure. The conductive layers 43 are obtained by forming holes in the green sheets before sintering and then by filling the holes with the conductive paste.

Figure 5:
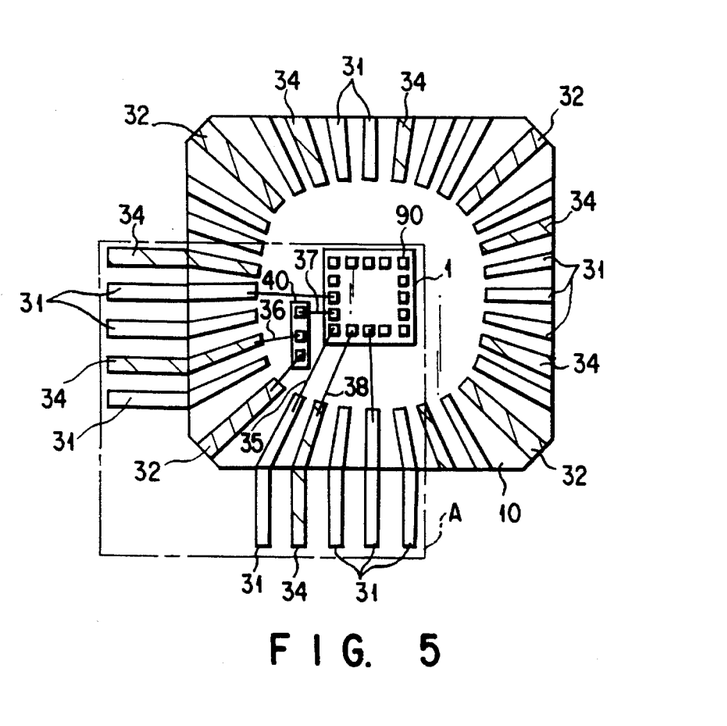
FIG. 5 is a plan view of a semiconductor device according to a second embodiment of the present invention.

A semiconductor device according to the second embodiment of the present invention will now be described, with reference to FIG. 5. FIG. 5 is a plan view of the semiconductor device. In FIG. 5, a multilayer wiring substrate and wires other than those of corner area A, a cap and a sealing member, are omitted.

As shown in FIG. 5, a semiconductor substrate 1 on which an integrated circuit is formed, is placed in a central portion of a mounting substrate 10 which is formed of ceramics such as aluminum nitride to constitute a package. A plurality of leads 31, 32 and 34 formed from a lead frame, are bonded onto the periphery of the mounting substrate 10 by an insulative sealing member such as glass. These leads are spaced away from the semiconductor substrate 1 and arranged opposite to each other with respect to the substrate 1. The end portions of the leads 31 and 34 are bonded to connecting electrodes 90 of pads formed on the substrate 1 by bonding wires 35 such as Au lines. The connecting electrodes 90 are electrically connected to the integrated circuit of the substrate 1. The leads 31 and 34 are employed as signal lines and power source lines, respectively, and corner leads 32 are used as power source lines. According to this second embodiment (FIG. 5), a multilayer wiring substrate 40 on the surface of which a plurality of connecting electrodes are formed, is disposed on the mounting substrate 10 and between the semiconductor substrate 1 and the leads 31, 32 and 34, and the connecting electrodes of the substrate 40 are connected to the corner leads 32 or power source leads 34 by bonding wires 36. The connecting electrodes of the multilayer wiring substrate 40 are bonded to the power source pads of the connecting electrodes 90 of the semiconductor substrate 1 by bonding wires 37. The power source leads 34 are directly bonded to the power source pads of the connecting electrodes 90 by bonding wires 38.

FIG. 5 shows in detail the corner area A only, and the other three corner areas have the same arrangement as that of the area A. In each of the three corner areas, too, a multilayer wiring substrate 40 is formed, and the potential of a corner lead 32 is set equal to that of each lead serving as a power source line. However, the multilayer wiring substrates of the corner areas may differ from one another in position and shape. The multilayer wiring substrate 40 of the second embodiment basically has the same structure as that of the substrate 40 of the first embodiment. In the substrate 40, a wiring pattern is formed inside, and a plurality of connecting electrodes are formed in the surface portion and connected to the wiring pattern through conductive paths. These connecting electrodes are electrically connected to each other through the wiring pattern. The multilayer wiring substrate 40 of this second embodiment (FIG. 5) includes more connecting electrodes than that of the first embodiment does, and the increased connecting electrodes are bonded to the connecting electrodes 90 of the semiconductor substrate 1 by wires.

Since the use of the multilayer wiring substrate increases the degree of freedom of wiring, the space of the mounting substrate can be used effectively.

Figure 6:
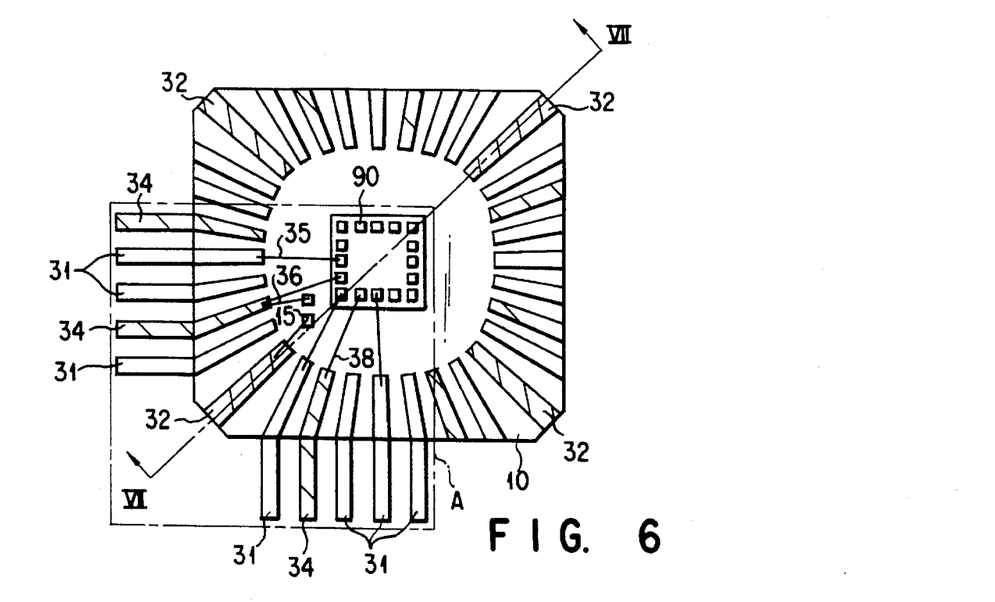
FIG. 6 is a plan view of a semiconductor device according to a third embodiment of the present invention.
Figure 7:
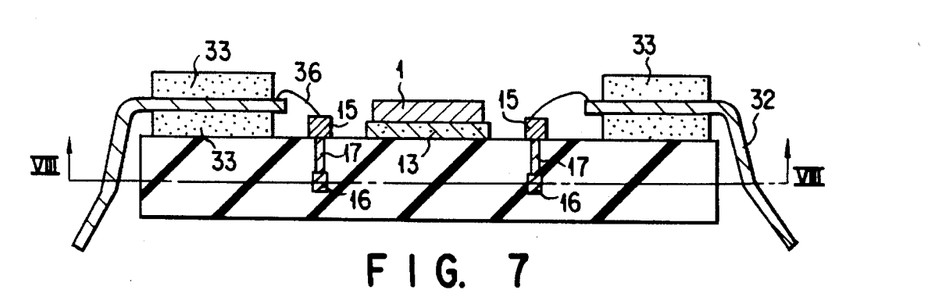
FIG. 7 is a cross-sectional view taken along the line VII—VII of FIG. 6.
Figure 8:
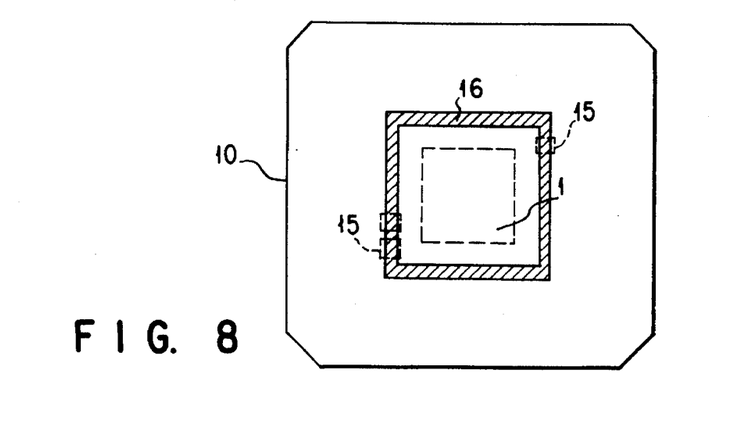
FIG. 8 is a view taken along the line VIII—VIII of FIG. 7 and perspectively showing a mounting substrate of the device of FIG. 6.

A semiconductor device according to a third embodiment of the present invention will now be described with reference to FIGS. 6 to 8. FIG. 6 is a plan view of the semiconductor device. In FIG. 6, a multilayer wiring substrate and wires other than those of corner area A, a cap and a sealing member, are omitted. FIG. 7 is a cross-sectional view of a mounting substrate taken along the line VII—VII of FIG. 6, and FIG. 8 is a view taken along the line VIII—VIII of FIG. 7 and perspectively showing the mounting substrate and a wiring layer formed therein.

A semiconductor substrate 1 on which an integrated circuit is formed, is adhered, by a conductive adhesive 13 such as epoxy resin, to a central portion of a mounting substrate 10 which is formed of ceramics such as aluminum nitride to constitute a package. A plurality of leads 31, 32 and 34 formed from a lead frame, are bonded onto the periphery of the mounting substrate 10 by an insulative sealing member such as glass. These leads are spaced away from the semiconductor substrate 1 and arranged opposite to each other with respect to the substrate 1. The end portions of the leads 31 and 34 are bonded to electrode pads (connecting electrodes) 90 formed on the surface of the substrate 1 by bonding wires 35 such as Au lines thereby to connect the integrated circuit and the leads 31 and 34. The leads 31 and 34 are employed as signal lines and power source lines, while the corner leads 32 are used as power source lines. The third embodiment is featured in the use of the mounting substrate 10 on the surface of which a plurality of connecting electrodes 15 are formed. The connecting electrodes 15 are arranged between the semiconductor substrate 1 and the leads 31, 32 and 34, and connected to the corner leads 32 or power source leads 34 by bonding wires 36.

The power source leads 34 and power source pads of the connecting electrodes 90 of the substrate 1 are connected to each other by bonding wires 38. As shown in FIG. 8, a power source layer 16 is formed in the mounting substrate 10 and connected to the connecting electrode 15 through a contact layer 17. As shown in FIG. 7, the semiconductor substrate 1 is fixed to the mounting substrate 10 by the conductive adhesive 13, and the leads are also fixed thereto by sealing members 33 such as glass. Note that neither connecting electrode 15 nor wire bonding between corner lead 32 and connecting electrode 15 is shown at the upper right-hand corner of FIG. 6 but in FIG. 7.

Since the connecting electrodes 15 can be formed in any position on the surface of the substrate 10, the degree of freedom of wiring is increased, and the space of the mounting substrate can be used effectively. In the third embodiment, as shown in FIG. 8, the power source layer 16 is formed continuously so as to surround the semiconductor substrate 1. However, it cannot be always formed continuously, but a plurality of power source layers can be formed separately from one another. To form the connecting electrode pads 15 and power source layer 16 on and in the mounting substrate 10, the above-described method is utilized. More specifically, a plurality of green sheets each having a conductive paste on its surface, are stacked one on another and sintered thereby to obtain the connecting electrode pads 15 and power source layer 16. The contact layers 17 are obtained by forming holes in the green sheets before sintering and then filling the holes with the conductive paste.

Figure 9:
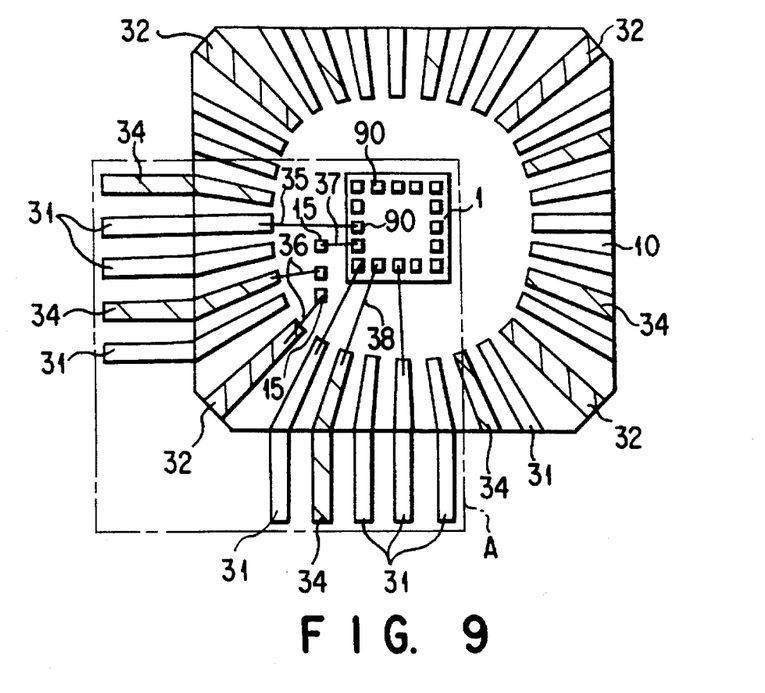
FIG. 9 is a plan view of a semiconductor device according to a fourth embodiment of the present invention.

A semiconductor device according to a fourth embodiment of the present invention will now be described, with reference to FIG. 9. FIG. 9 is a plan view of the semiconductor device, and a multilayer wiring substrate and wires other than those of corner area A, a cap and a sealing member, are omitted therefrom.

As illustrated in FIG. 9, a semiconductor substrate 1 on which an integrated circuit is formed, is placed in a central portion of a mounting substrate 10 which constitutes a component of a package. A plurality of leads 31, 32 and 34 formed from a lead frame, are bonded onto the periphery of the mounting substrate 10 by an insulative sealing member such as glass. These leads are spaced away from the semiconductor substrate 1 and arranged opposite to each other with respect to the substrate 1. The end portions of the leads 31 and 34 are bonded to connecting electrodes 90 formed on the surface of the substrate 1, by bonding wires 35 such as Au lines thereby to connect these leads 31 and 34 and the integrated circuit on the substrate 1. The leads 31 and 34 are employed as signal lines and power source lines, respectively. The present invention is featured in that the corner leads 32 are used as power source lines. According to this fourth embodiment (FIG. 9), a plurality of connecting electrodes 15 are formed on the surface of the substrate 10 and arranged between the substrate 1 and the leads 31, 32 and 34. The electrodes 15 are connected to the corner leads 32 or power source leads 34 by bonding wires 36 and also connected to the power source pads of the connecting electrodes 90 by bonding wires 37.

The power source leads 34 are directly bonded to the power source pads of the connecting electrodes 90 by bonding wires 38. FIG. 9 shows in detail the corner area A only, and the other three corner areas have the same arrangement as that of the area A. In each of the three corner areas, too, the mounting substrate 10 includes connecting electrodes 15, and the potential of corner lead 32 is set equal to that of the power source leads. However, the connecting electrodes 15 may slightly differ from one another in position and shape. Power source layers are formed in the mounting substrate 10 and connected to the connecting electrodes 15 through conductive layers, respectively.

The mounting substrate of this fourth embodiment (FIG. 9) includes more connecting electrodes than that of the third embodiment does, and the increased connecting electrodes are bonded to the connecting electrodes 90 of power source pads of the semiconductor substrate 1 by wires. Since the connecting electrodes 15 can be formed in any position on the surface of the mounting substrate 10, the degree of freedom of wiring is increased, and the space of the mounting substrate can be used effectively.

Figure 10:
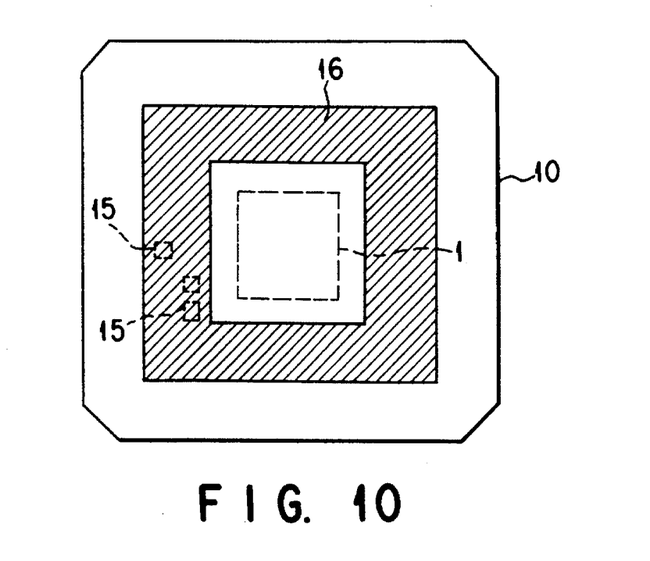
FIG. 10 is a view perspectively showing a mounting substrate of a semiconductor device according to a fifth embodiment of the present invention.

A semiconductor device according to a fifth embodiment of the present invention will now be described, with reference to FIG. 10. FIG. 10 is a view perspectively showing a mounting substrate 10 mounted with a semiconductor substrate 1 and a wiring layer formed therein.

Referring to FIG. 10, the semiconductor substrate 1 is adhered, by a conductive adhesive such as epoxy resin, to a central portion of the mounting substrate 10 which is formed of ceramics such as aluminum nitride to constitute a package. A plurality of leads (not shown) formed from a lead frame, are bonded onto the periphery of the mounting substrate 10 by an insulative sealing mender such as glass. The leads are bonded to connecting electrodes of the substrate 1 and connecting electrodes 15 of the substrate 10 by wires. The connecting electrodes 15 are bonded to the connecting electrodes of the substrates 1 by wires. These leads are employed as signal lines and power source lines. The connecting electrodes 15 are interposed between the semiconductor substrate 1 and the leads. As shown in FIG. 10, a power source layer 16 is formed inside the mounting substrate 10 and connected to the connecting electrodes 15 through contact layers. Since the power source layer 16 of this fifth embodiment (FIG. 10) is broader than that of the fourth embodiment (FIG. 9), the connecting electrodes 15 can be positioned more freely. The broader power source layer 16 need not be formed continuously, but can be disconnected at an arbitrary point or separated into several parts.

Since the connecting electrodes 15 can be formed in any position on the surface of the substrate 10, the degree of freedom of wiring is increased, and the space of the mounting substrate can be used effectively. In the fifth embodiment, as shown in FIG. 10, the power source layer 16 is formed continuously so as to surround the semiconductor substrate 1. However, it cannot be always formed continuously, but a plurality of power source layers can be formed separately from one another. The mounting substrate 10 is formed using the same method as in the fourth embodiment (FIG. 9).

Figure 11A:
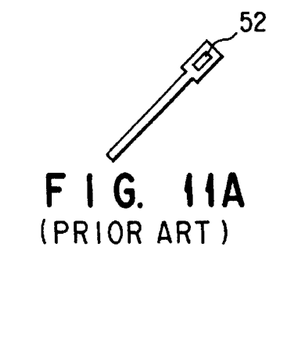
FIG. 11A is a plan view of a corner lead of a prior art semiconductor device.

The shapes of corner leads of prior art and each of the above embodiments will be described, with reference to FIGS. 11A, 11B and 11C. When the leads 32 and 34 are formed from a lead frame as described above, the corner leads serve as supporting pins of the lead frame. The conventional corner leads have not been used as power source leads or signal leads; therefore, none of the corner leads have any space for connecting the bonding wires, as shown in FIG. 11A. However, since the corner lead 32 of the present invention is used as power source leads (inner leads), a space for bonding wires has to be required in at least an end portion of the corner lead. The corner leads shown in FIGS. 11B and 11C are typical examples of the present invention and each have a space at its end.

Figure 11B:
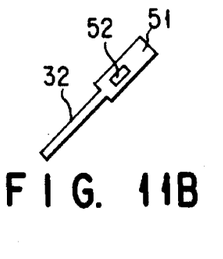
FIG. 11B and 11C are plan views of corner leads of the semiconductor device of the present invention.
Figure 11C:
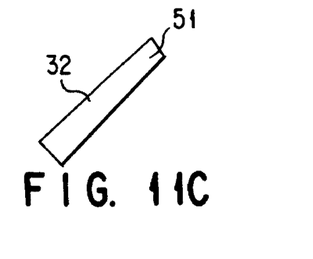

The corner leads shown in FIGS. 11A and 11B each have a through hole 52 at its end, and this hole is formed to improve the conduction of the sealing member for connecting the mounting substrate with a cap and also improve the adherence of the sealing member.

As described above, in the present invention, the corner leads can be set to the same potential as that of the power source leads such as grounds to reduce in inductance and thus in noise. Since, moreover, the number of signal leads interposed between two power source leads are decreased to the minimum value, the semiconductor device can be easily used within a high frequency band ranging from 300 MHz to 1 GHz.

Consequently, since a usable frequency is not determined every lead, the variations in frequency can be lessened and thus the impedance matching can be made.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

a semiconductor substrate on which an integrated circuit is formed, said semiconductor substrate having connecting electrodes of signal pads and power source pads on a surface thereof;

a polygonal mounting substrate made of a ceramic material and having a major surface, said semiconductor substrate being located at a central portion of said major surface;

a plurality of leads including signal leads and power source leads, end portions of said plurality of leads being arranged on a periphery of the central portion of the major surface of said mounting substrate so as to be facing said semiconductor substrate;

at least one multilayer wiring substrate made of a ceramic material and including a plurality of connecting electrodes on a surface thereof and fixed onto said mounting substrate between said semiconductor substrate and said leads, said connecting electrodes being electrically connected to each other by an inner wiring layer formed in said multilayer wiring substrate;

bonding wires for bonding the end portions of said leads to the connecting electrodes of said semiconductor substrate and to the connecting electrodes of said multilayer wiring substrate; and a cap for covering at least said semiconductor substrate, said bonding wires, and the end portions of said leads, wherein said plurality of leads include corner leads extending from corner portions of said mounting substrate toward said semiconductor substrate, and said corner leads are set to the same potential as that of said power leads.

2. The semiconductor device according to claim 1, wherein said signal leads are bonded to the signal pads of said semiconductor substrate by said bonding wires, said power source leads are bonded to the power source pads of said semiconductor substrate by said bonding wires, and said power source leads and said corner leads are bonded to the connecting electrodes of said multilayer wiring substrate by said bonding wires.

3. The semiconductor device according to claim 1, wherein said signal leads are bonded to the signal pads of said semiconductor substrate by said bonding wires, said corner leads are bonded to the connecting electrodes of said multilayer wiring substrate by said bonding wires, said power source leads are bonded to either the connecting electrodes of said multilayer wiring substrate or to the power source pads of said semiconductor substrate and the connecting electrodes of said multilayer wiring substrate.

4. A semiconductor device comprising:

a semiconductor substrate on which an integrated circuit is formed, said semiconductor substrate having connecting electrodes of signal pads and power source pads on a surface thereof;

a polygonal mounting substrate having a major surface, said semiconductor substrate being located at a central portion of said major surface;

a plurality of leads including signal leads and power source leads, end portions of said plurality of leads being arranged on a periphery of the central portion of the major surface of said mounting substrate so as to be facing said semiconductor substrate;

a plurality of connecting electrodes formed directly on the major surface of said mounting substrate between said semiconductor substrate and said leads, and electrically connected to each other by an inner wiring layer formed in said mounting substrate;

bonding wires for bonding the end portions of said leads to the connecting electrodes of said semiconductor substrate and to the connecting electrodes of said mounting substrate; and a cap for covering at least said semiconductor substrate, said bonding wires, and the end portions of said leads, wherein said plurality of leads include corner leads extending from corner portions of said mounting substrate toward said semiconductor substrate and said corner leads are set to the same potential as that of said power leads.

5. The semiconductor device according to claim 4, wherein said signal leads are bonded to the signal pads of said semiconductor substrate by said bonding wires, said power source leads are bonded to the power source pads of said semiconductor substrate by said bonding wires, and said power source leads and said corner leads are bonded to the connecting electrodes of said mounting substrate by said bonding wires.

6. The semiconductor device according to claim 4, wherein said signal leads are bonded to the signal pads of said semiconductor substrate by said bonding wires, said corner leads are bonded to the connecting electrodes of said mounting substrate by said bonding wires, said power source leads are bonded to either the connecting electrodes of said mounting substrate or the power source pads of said semiconductor substrate and the connecting electrodes of said mounting substrate.

* * * * *